United States Patent

Wakayama et al.

[11] Patent Number: 6,064,244
[45] Date of Patent: *May 16, 2000

[54] PHASE-LOCKED LOOP CIRCUIT PERMITTING REDUCTION OF CIRCUIT SIZE

[75] Inventors: Shigetoshi Wakayama; Kohtaroh Gotoh; Miyoshi Saito; Junji Ogawa; Hirotaka Tamura, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/813,632

[22] Filed: Mar. 7, 1997

[30] Foreign Application Priority Data

Oct. 11, 1996 [JP] Japan ................................ 8-270154

[51] Int. Cl.⁷ ...................................................... H03L 7/06

[52] U.S. Cl. ........................... 327/158; 327/158; 327/146; 327/147; 327/149; 327/150; 327/151; 327/153; 327/155; 327/156; 327/241; 327/242; 327/243

[58] Field of Search ..................................... 327/146, 147, 327/149, 150, 151, 153, 155, 156, 158, 159, 160, 161, 236, 241, 242, 243–245, 12; 377/46, 54, 64

[56] References Cited

U.S. PATENT DOCUMENTS

| | | | |
|---|---|---|---|
| 5,173,617 | 12/1992 | Alsup et al. | 327/158 |
| 5,216,302 | 6/1993 | Tanizawa | 327/158 |
| 5,260,608 | 11/1993 | Marbot | 327/158 |
| 5,471,165 | 11/1995 | Liedberg | 327/250 |
| 5,629,651 | 5/1997 | Mizuno | 327/158 |

*Primary Examiner*—Timothy P. Callahan
*Assistant Examiner*—Cassandra Cox
*Attorney, Agent, or Firm*—Arent Fox Kintner Plotkin & Kahn PLLC

[57] ABSTRACT

A phase-locked loop circuit is constituted in such a manner that a delayed signal created by causing an input signal to loop through a delay stage a plurality of times is compared in terms of phase with the input signal, and an amount of delay in the delay stage is controlled in accordance with the comparison result of the delayed signal and the input signal. Therefore, the circuit size can be reduced with a reduced number of delay units constituting the delay stage.

28 Claims, 16 Drawing Sheets

PHASE-LOCKED LOOP CIRCUIT PERMITTING REDUCTION OF CIRCUIT SIZE

BACKGROUND OF THE INVENTION

1. Field of the Invention

The present invention relates to a phase-locked loop circuit and a semiconductor integrated circuit having the phase-locked loop circuit, and more particularly, to a phase-locked loop circuit that permits a reduction of circuit size.

2. Description of the Related Art

In recent years, in accordance with the operating speeds of CPUs getting faster and faster, high speed operation has come to be demanded of memory circuits (for example, DRAMs) and other peripheral circuits. In order to prevent timing errors from occurring between the circuits in high speed operation, it is practiced, for example, to mount a phase-locked loop (PLL) circuit to synchronize the memory circuits and other peripheral circuits to an external clock, thus synchronizing each circuit to the CPU clock.

Namely, in the prior art, a PLL circuit that generates a waveform using a voltage-controlled oscillator (VCO) has been used as the phase-locked loop circuit. However, the VCO has the problems of increased circuit size and increased power consumption. Further, the PLL circuit involves such problems as degraded precision due to noise occurring in analog portions.

In view of this situation, a delay-locked loop (DLL) involving a delay stage has been attracting attention as a circuit capable of providing signal synchronization at high operating frequency. The DLL, however, has the problem that the circuit size is increased because of the large number of logic gates (for example, inverters) required to construct the delay stage.

This has therefore lead to the problem that it is difficult to reduce the power consumption and the size of the entire circuit because the phase-locked loop circuit occupies a large portion of the entire circuit.

SUMMARY OF THE INVENTION

It is an object of the present invention to provide a phase-locked loop circuit which is small in circuit size and which can reduce power consumption. It is also an object of the present invention to provide a phase-locked loop circuit capable of generating a plurality of synchronously controlled signals with different phases.

According to the present invention, there is provided a phase-locked loop circuit wherein a delayed signal created by causing an input signal to loop through a delay stage a plurality of times is compared in terms of phase with the input signal, and an amount of delay in the delay stage is controlled in accordance with the comparison result of the delayed signal and the input signal.

Further, according to the present invention, there is also provided a semiconductor integrated circuit having a phase-locked loop circuit, wherein a delayed signal created by causing an input signal to loop through a delay stage a plurality of times is compared in terms of phase with the input signal, and an amount of delay in the delay stage is controlled in accordance with the comparison result of the delayed signal and the input signal.

The phase-locked loop circuit may comprise a phase comparator for comparing the phase of the input signal with the phase of the delayed signal; and an up-down counter being controlled in an up or down direction according to an output of the phase comparator, wherein the delay stage may include a plurality of delay units connected in cascade, and thereby an amount of delay produced up to a delay unit specified by the up-down counter may be given. The up-down counter may be controlled by an up signal or down signal from the phase comparator.

The phase-locked loop circuit may further comprise a slicer circuit and a toggle circuit which is supplied with the up signal or down signal from the phase comparator, and generates a plurality of up signals or down signals within a pulse width of the up signal or down signal.

The up-down counter may include a plurality of unit circuits connected in cascade, and each of the unit circuits may comprise a first inverter; a first transistor connected to the first inverter and a high-level power supply line and whose gate is supplied with the up signal; a second inverter; a second transistor connected to the second inverter and a low-level power supply line and whose gate is supplied with the down signal; and cross-coupled third and fourth inverters, whose one node may be supplied with an output signal from the first inverter and whose other node may be supplied with an output signal from the second inverter.

The up-down counter may include a plurality of exclusive-OR circuits each for accepting outputs from two adjacent unit circuits, and a signal may be output only from one exclusive-OR circuit that has detected a change in the output signals of the two adjacent unit circuits, thereby selecting a designated delay unit in the delay stage. Each of the up signal and down signal may include two signals, the first and second up signals and the first and second down signals, respectively, and the first up signal and the first down signal may be supplied to the unit circuits at even-numbered stages while the second up signal and the second down signal are supplied to the unit circuits at odd-numbered stages.

The phase-locked loop circuit may further comprise a selection circuit which is supplied with the input signal and the delayed signal, and the selection circuit may select a signal to be supplied to the delay stage and the phase comparator, in such a manner as to synchronize predetermined cycles of the delayed signal with respect to one cycle of the input signal. The selection circuit may include a counter unit, and control the number of times that the delay signal loops through the delay stage by detecting a change in the delayed signal using the counter unit.

The counter unit may comprise a first ring counter which counts by detecting a falling edge of the delayed signal, and a second ring counter which counts by detecting a rising edge of the delayed signal. The selection circuit may generate a plurality of synchronized signals with different phases by taking logic between the first and second ring counters and the delayed signal. Each of the first and second ring counters may comprise a plurality of unit circuits connected in cascade, and the number of the synchronized signals may be controlled by selecting the number of the unit circuits.

Each of the delay units may comprise two inverters connected in cascade and a transfer gate for selecting an output signal of the delay unit. Each of the delay units may comprise a single inverter and a transfer gate for selecting an output signal of the delay unit. The phase-locked loop circuit may include a signal logic control circuit for controlling logic of the output signal of the delay unit in accordance with the number of shift stages in the up-down counter.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

The basic functional configuration of a phase-locked loop circuit according to the present invention will be described first.

Figure 1:
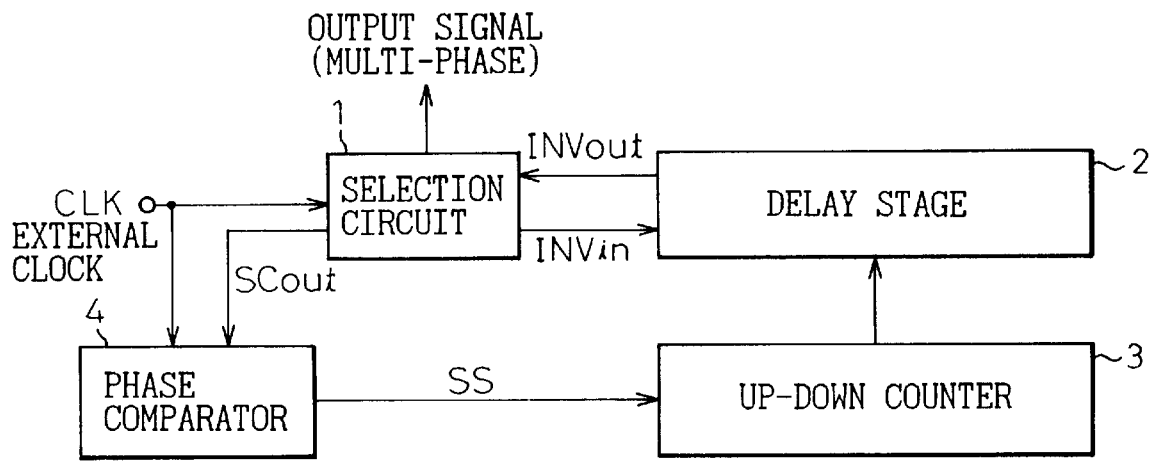
FIG. 1 is a block diagram showing the functional configuration of a phase-locked loop circuit according to the present invention.

FIG. 1 is a block diagram showing the functional configuration of the phase-locked loop circuit according to the present invention. In the figure, reference numeral 1 is a selection circuit, 2 is a delay stage, 3 is an up-down counter, and 4 is a phase comparator. Further, reference sign CLK is an external clock (clock signal), INVout is an output signal (synchronized signal, delayed signal) from the delay stage 2, INVin is an input signal (feedback signal) to the delay stage 2, SCout is an signal (INVout) output from the selection circuit 1 and supplied to the phase comparator 4 for phase comparison with the clock signal CLK, and SS is an output signal from the phase comparator 4 and used to control the up-down counter 3.

As shown in FIG. 1, in the phase-locked loop circuit of the present invention, the clock signal CLK is supplied to the delay stage 2 via the selection circuit 1 as well as to the phase comparator 4. The phase comparator 4 compares the clock signal CLK with the output signal (delayed signal INVout) supplied from the delay stage 2 via the selection circuit 1, and controls the up-down counter 3 in accordance with the result of the comparison (SS). The delay stage 2 comprises a plurality of stages of delay elements (for example, inverters) connected in cascade, and provides a delay produced up to the delay element selected by the up-down counter 3. Here, the selection circuit 1, as will be described later, is configured to perform switching so that the clock signal CLK supplied to the delay stage 2 is caused to loop through the delay stage 2 a predetermined number of times, that is, the output signal INVout of the delay stage is fed back as the input signal INVin a predetermined number of times. This makes it possible to drastically reduce the number of required delay elements compared with the prior art delay stage configuration.

Figure 2:
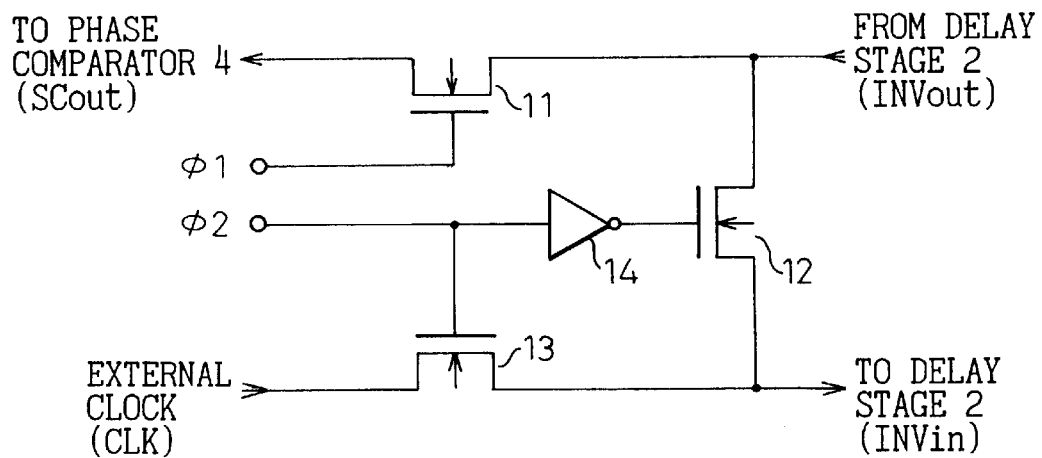
FIG. 2 is a diagram showing the basic configuration of a selection circuit in the phase-locked loop circuit of FIG. 1.

FIG. 2 is a diagram showing the basic configuration of the selection circuit in the phase-locked loop circuit of FIG. 1.

As shown in FIG. 2, the selection circuit 1 comprises N-channel MOS transistors (switch means) 11 to 13 and an inverter 14.

Figure 3:
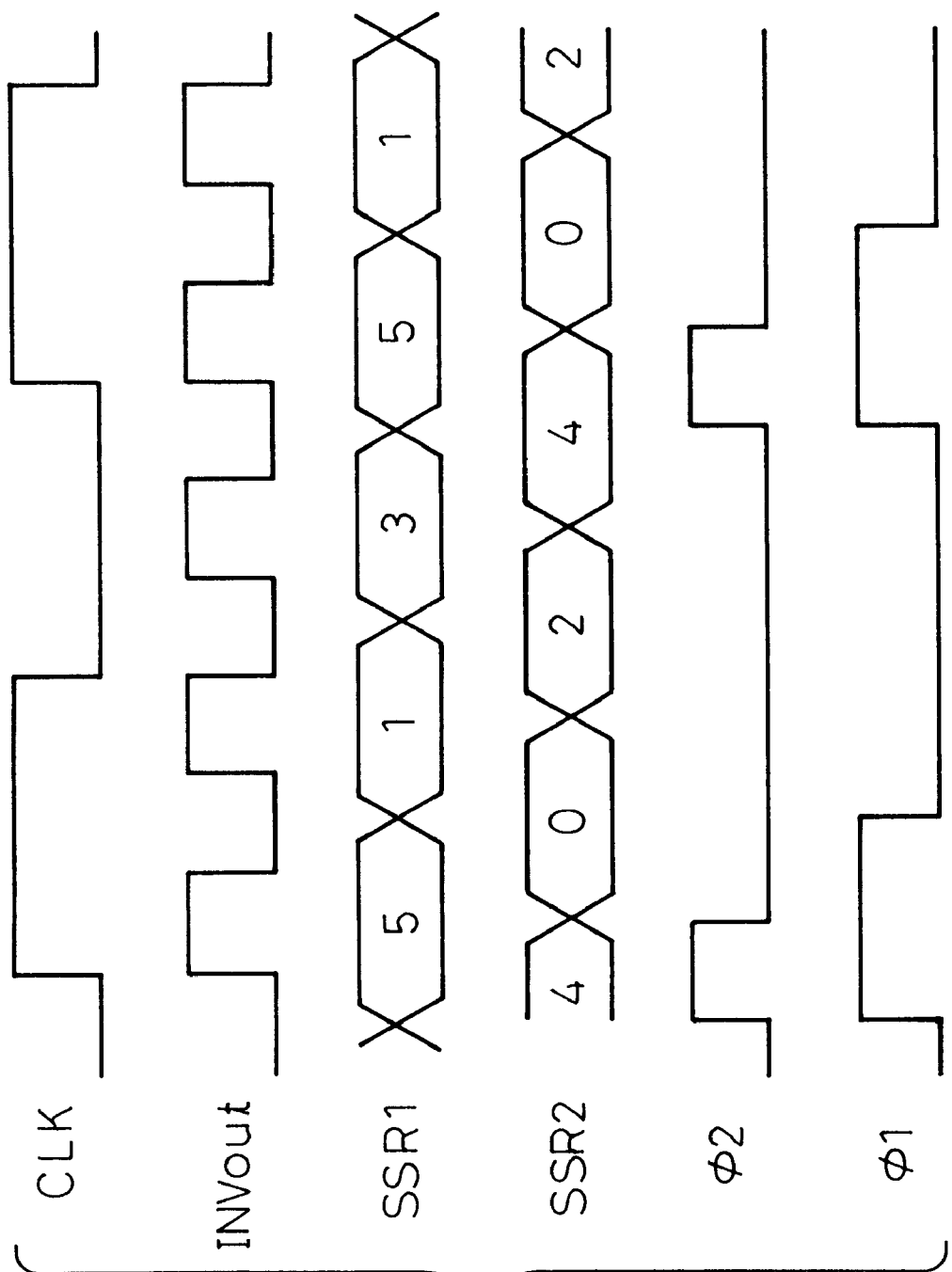
FIG. 3 is a timing diagram for explaining the operation of the selection circuit of FIG. 2.

FIG. 3 is a timing diagram for explaining the operation of the selection circuit of FIG. 2. In the figure, reference sign SSR1 is an output signal from a falling edge detection shift register (R1), SSR2 is an output signal from a rising edge detection shift register (R2), and $\phi 1$ and $\phi 2$ are control signals.

As shown in FIG. 3, first, when the control signals $\phi 1$ and $\phi 2$ are raised to the high level "H", the transistors 11 and 13 are turned on, and the transistor 12 is turned off. At this time, the external clock (clock signal) CLK is supplied to the delay stage 2 via the transistor 13. Next, when the control signal $\phi 2$ changes to the low level "L", the transistor 13 is turned off, and the transistor 12 is turned on. After a delay, the control signal $\phi 1$ also changes to the low level "L". Here, during the high level "H" period of the control signal $\phi 1$, the output signal INVout of the delay stage 2 is supplied to the phase comparator 4 via the transistor 11.

When the control signals $\phi 1$ and $\phi 2$ are both at the low level "L", the output signal INVout of the delay stage 2 is fed back as the input signal INVin to the delay stage 2 via the transistor 12. In this way, the signal (INVout) is caused to loop through the delay stage 2 a plurality of times, the signal thus being delayed according to the number of delay elements it passes through.

In the timing diagram of FIG. 3, it is shown that, for one cycle of the external clock CLK, the output signal (INVout) is caused to loop six times through the delay stage 2, that is, three cycles of the synchronized signal INVout are made to correspond to one cycle of the external clock CLK. Accordingly, the phase comparator 4 performs phase comparison between the external clock CLK at the rising timing of each cycle of it and the synchronized signal (output signal of the delay stage 2) INVout at the rising timing of every third cycle of it. With the output of the phase comparator 4, the delay path through to the specified delay element in the delay stage 2 is selected via the up-down counter 3, and the phase-locked signal (INVout) is thus output.

Here, the control signal $\phi 1$ is generated, for example, from data "5" in the output signal SSR1 of the falling edge detection shift register (ring counter R1), and the control signal $\phi 2$ is generated by ANDing data "5" in the output signal SSR1 of the falling edge detection shift register with data "4" in the output signal SSR2 of the rising edge detection shift register (ring counter R2).

In this way, according to the phase-locked loop circuit of the present invention, the signal (clock CLK) is delayed by being caused to loop through the delay stage 2 the number of times specified by the selection circuit 1; this configuration serves to reduce the number of delay elements required in the delay stage 2, achieving a reduction of circuit size.

The embodiments of the phase-locked loop circuit according to the present invention will now be described below with reference to the accompanying drawings.

Figure 4:
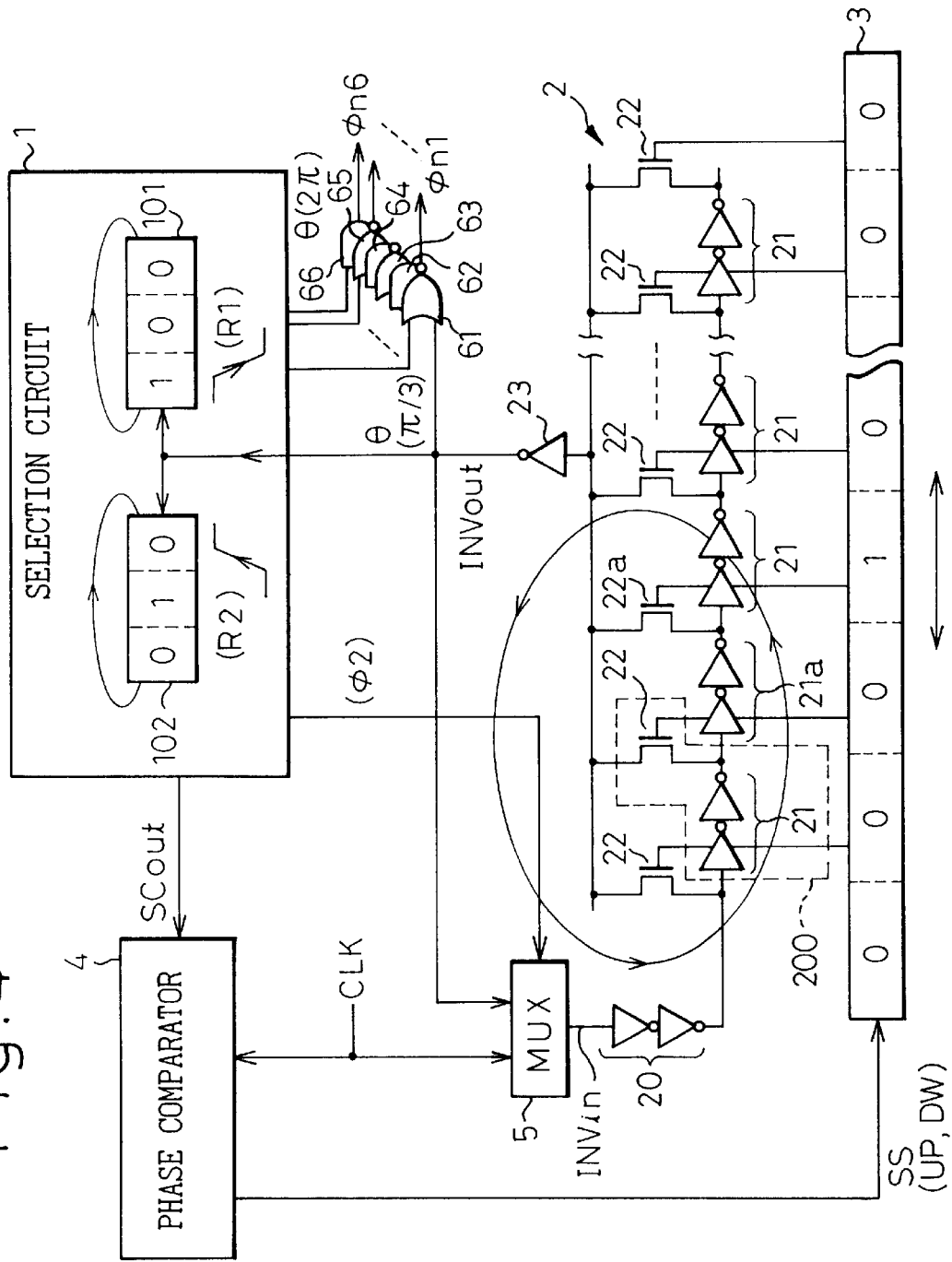
FIG. 4 is a block diagram showing one embodiment of the phase-locked loop circuit according to the present invention.

FIG. 4 is a block diagram showing one embodiment of the phase-locked loop circuit of the present invention. In FIG. 4, reference numeral 1 is a selection circuit, 2 is a delay stage (delay chain), 3 is an up-down counter (bidirectional counter), 4 is a phase comparator, and 5 is a delay stage input selection circuit (multiplexer: MUX). Here, the delay stage input selection circuit 5 corresponds to the switches (transistors) 12 and 13 previously described with reference to FIG. 2, and selects one or the other of two signals, the clock signal (external clock) CLK or the output signal (delayed signal INVout) of the delay stage 2, and outputs the selected signal as the input signal INVin to the delay stage 2.

As shown in FIG. 4, in the phase-locked loop circuit of the present embodiment, the clock signal CLK is supplied to the delay stage input selection circuit 5 and also to the phase comparator 4. The phase comparator 4 compares the phase of the clock signal CLK with that of the output signal (INVout: SCout) of the delay stage 2 supplied via the selection circuit 1, and supplies the control signal SS to the up-down counter 3 in accordance with the result of the comparison.

The delay stage 2 comprises a plurality of stages of delay elements connected in cascade, and provides a delay produced up to the delay element selected by the up-down counter 3. More specifically, as shown in FIG. 4, the delay stage 2 comprises a plurality of delay units 200 connected in cascade, each delay unit 200 consisting of two inverters 21 connected in series and a transfer gate (N-channel MOS transistor) 22. The transfer gate 22a in the delay unit selected by the up-down counter 3 is switched on, so that a signal given a delay up to the inverter 21a in that delay unit is output, through an inverter 23, as the output signal INVout of the delay stage. In the up-down counter 3, only one designated stage is set to "1" (high level "H"), and correspondingly to that one high-level stage, only one transfer gate 22a in the delay stage 2 is switched on, with all other transfer gates 22 remaining off.

The delay stage output signal INVout, after passing through the selection circuit 1, is fed back via the delay stage input selection circuit 5 to the delay stage 2 as the delay stage input signal INVin which is then delayed further through it. In the selection circuit 1, a first ring counter 101 (3-bit shift register R1) counts the delay stage output signal INVout by detecting its falling edge, and a second ring counter 102 (3-bit shift register R2) counts the same signal by detecting its rising edge; when a designated number of voltage changes have been detected in the signal INVout, the delay stage output signal INVout is supplied as the signal SCout to the phase comparator 4. At the same time, the delay stage input selection circuit 5 selects the clock signal (external clock) CLK instead of the delay stage output signal INVout selected up to that time, and supplies the clock signal CLK as the input signal INVin to the delay stage 2.

The phase comparator 4 performs phase comparison between the clock signal CLK and the signal SCout (INVout) supplied from the selection circuit 1, and if the signal SCout is advanced in phase with respect to the clock signal CLK, outputs an up signal as the control signal SS to the up-down counter 3 so that the transfer gate to the right in FIG. 4 is selected to increase the amount of delay to be introduced in the signal INVout (SCout); conversely, if the signal SCout is delayed in phase with respect to the clock signal CLK, the phase comparator 4 outputs a down signal as the control signal SS to the up-down counter 3 so that the transfer gate to the left in FIG. 4 is selected to reduce the amount of delay to be introduced in the signal INVout (SCout).

As shown in FIG. 4, the phase-locked loop circuit of the present embodiment is configured to produce synchronized signals with different phases by performing logic operations between the outputs of the first and second ring counters 101 and 102 (R1 and R2) provided in the selection circuit 1 and the output signal INVout of the delay stage 2. More specifically, each output of the first ring counter 101 (R1), which is a 3-bit shift register that counts by detecting the falling edge of the delay stage output signal INVout, is ANDed with the delay stage output signal INVout, and the respective results are extracted from AND gates 62, 64, and 66, thereby generating signals $\phi n2$, $\phi n4$, and $\phi n6$ which are 120 degrees ($2\pi/3$), 240 degrees ($4\pi/3$), and 360 degrees ($2\pi$) out of phase with respect to the clock signal CLK (each signal is a pulse signal that rises with a prescribed phase delay with respect to the rising of the clock signal CLK). Likewise, each output of the second ring counter 102 (R2), which is a 3-bit shift register that counts by detecting the rising edge of the delay stage output signal INVout, is NORed with the delay stage output signal INVout, and the respective results are extracted from NOR gates 61, 63, and 65, thereby generating signals $\phi n1$, $\phi n3$, and $\phi n5$ which are 60 degrees ($\pi/3$), 180 degrees ($\pi$), and 300 degrees ($5\pi/3$) out of phase with respect to the clock signal CLK (each signal is a pulse signal that rises with a prescribed phase delay with respect to the rising of the clock signal CLK).

In the present embodiment, the configuration has been described as generating six synchronized signals, $\phi n1$ to $\phi n6$, which are 60 degrees apart in phase, but this configuration can be changed in various ways; for example, the configuration can be so changed as to generate eight synchronized signals, $\phi n1$ to $\phi n8$, which are 45 degrees apart in phase.

Figure 5:
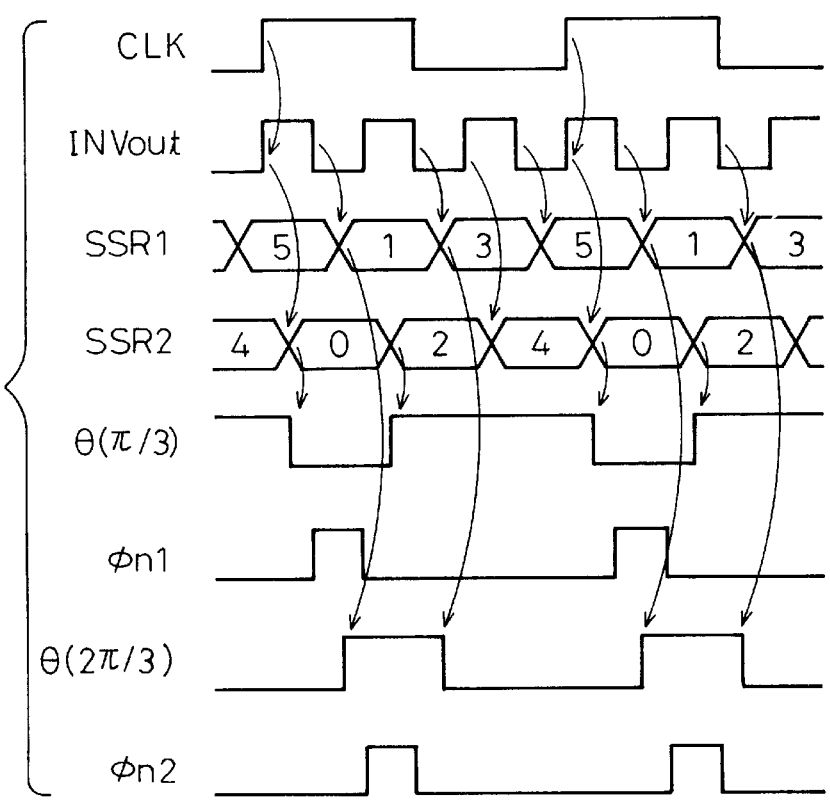
FIG. 5 is a timing diagram for explaining the operation of the phase-locked loop circuit of FIG. 4.

FIG. 5 is a timing diagram for explaining the operation of the phase-locked loop circuit of FIG. 4, and more specifically for explaining the generation of the signal $\phi n1$, whose phase is delayed by 60 degrees with respect to the clock signal CLK, and the signal $\phi n2$, whose phase is delayed by 120 degrees.

In FIG. 5, reference sign SSR1 designates the output signal of the falling edge detection shift register R1 (first ring counter 101), and SSR2 indicates the output signal of the rising edge detection shift register R2 (second ring counter 102). In the timing diagram of FIG. 5, it is shown that, for one cycle of the clock signal CLK, the output signal (INVout) is caused to loop six times through the delay stage 2, that is, three cycles of the synchronized signal INVout are made to correspond to one cycle of the external clock CLK. Accordingly, the rising timing of each cycle of the external clock CLK synchronizes to the rising timing of every third cycle of the synchronized signal (delay stage output signal) INVout.

Since three cycles of the synchronized signal INVout are synchronized with respect to one cycle of the clock signal CLK, as shown in FIG. 5, the signal $\phi n1$ which produces a positive pulse 60 degrees delayed in phase with respect to the clock signal CLK, for example, can be generated by performing a logic operation between the signal of data "0" (signal θ (π/3)) clocked out of the second ring counter 102 and the synchronized signal INVout. Here, the signal φn1 is a signal which goes to the high level "H" only when the signal θ (π/3) clocked out of the second ring counter 102 and the synchronized signal INVout are both at the low level "L", and which is generated as an output of the NOR gate 61.

Likewise, the signal φn2 which produces a positive pulse 120 degrees delayed in phase with respect to the clock signal CLK, for example, can be generated by performing a logic operation between the signal of data "1" (signal θ (2π/3)) clocked out of the first ring counter 101 and the synchronized signal INVout. Here, the signal φn2 is a signal which goes to the high level "H" only when the signal θ (2π/3) clocked out of the first ring counter 101 and the synchronized signal INVout are both at the high level "H", and which is generated as an output of the AND gate 62. Needless to say, the logic of these signals (φn1 to φn6) changes depending on the logic gates, etc. used.

In this way, according to the phase-locked loop circuit of the present embodiment, the signal (clock CLK) is delayed by being caused to loop through the delay stage 2 the number of times specified by the selection circuit 1; this configuration serves to reduce the number of delay elements required in the delay stage 2, achieving a reduction of circuit size. As a result, the area that the phase-locked loop circuit (the delay stage) occupies can be reduced. Furthermore, according to the phase-locked loop circuit of the present embodiment, a plurality of output signals (φn1 to φn6) synchronized with different phases to the clock signal (external clock) CLK can be generated. It will also be noted that, in the present embodiment, the number of output signals divided in phase can be controlled by adjusting the number of times that the signal loops through the delay stage by using the ring counters.

Figure 6:
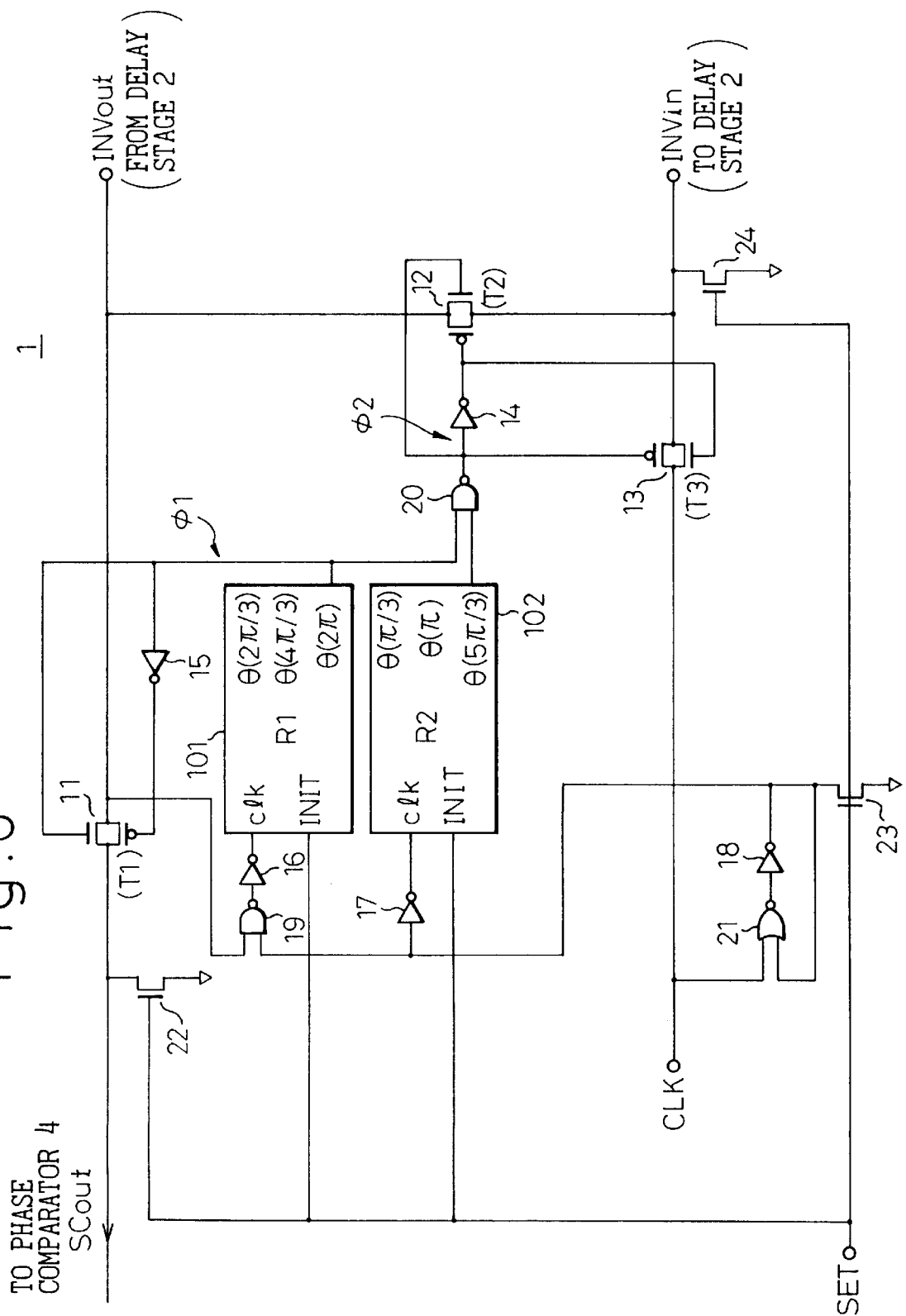
FIG. 6 is a block circuit diagram showing one example of the selection circuit in the phase-locked loop circuit of FIG. 4.
Figure 7:
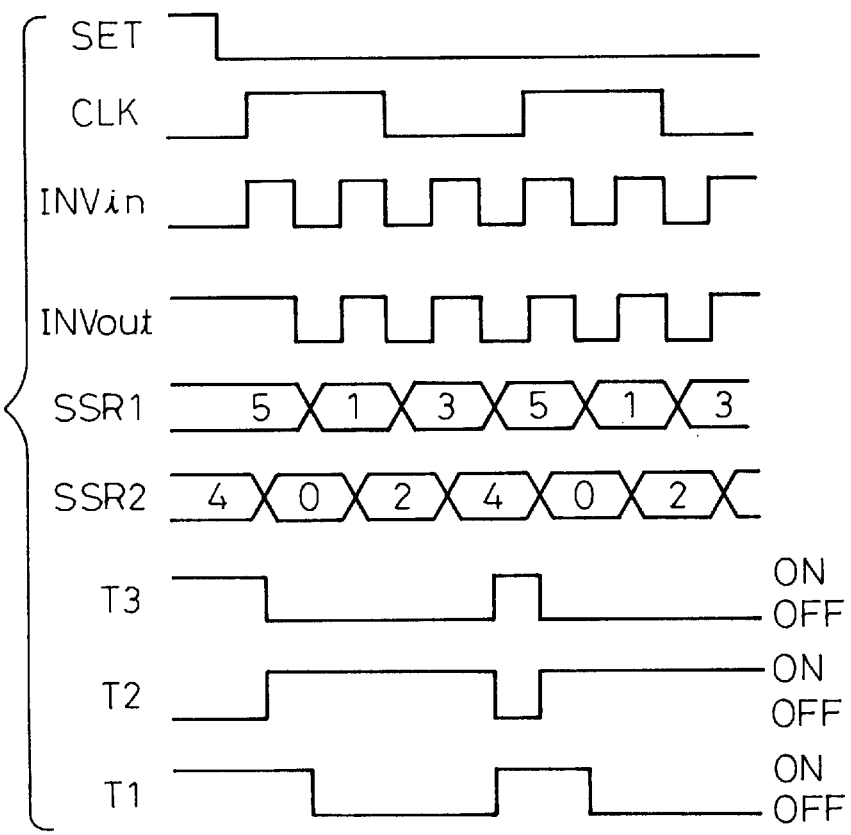
FIG. 7 is a timing diagram for explaining the operation of the selection circuit of FIG. 6.

FIG. 6 is a block diagram showing one example of the selection circuit used in the phase-locked loop circuit of FIG. 4, and FIG. 7 is a timing diagram for explaining the operation of the selection circuit of FIG. 6.

As is apparent from the comparison between FIGS. 2 and 6, in the selection circuit of the present embodiment, the switch means 11 to 13 are constructed from transfer gates each consisting of an N-channel and a P-channel MOS transistor. More specifically, the selection circuit 1 comprises the transfer gates 11 to 13, inverters 14 to 18, NAND gates 19 and 20, NOR gate 21, and N-channel MOS transistors 22 to 24. Here, the control signal φ1 is generated from the output signal θ (2π) (data "5") clocked out of the first ring counter 101, and the control signal φ2 is generated as an output of the NAND gate 20 to which the above output signal θ (2π) and the output signal θ (5π/3) (data "4") clocked out of the second ring counter 102 are input. The logic of these control signals φ1 and φ2, and the logic gates, etc. used, can be modified in various ways according to the circuit configuration, as previously noted.

As shown in FIGS. 6 and 7, first, when the set signal SET goes to the high level "H", the transistors 22 to 24 are turned on, setting the signals CLK, INVout, and INVin to the low level "L", while, at the same time, initialization inputs INIT at the ring counters 101 and 102 are both set to the high level "H", thus resetting the respective counters.

Next, the control signals φ1 and φ2 go to the high level "H", turning the transfer gates 11 (T1) and 13 (T3) on and the transfer gate 12 (T2) off. At this time, the clock signal CLK is supplied as the input signal INVin to the delay stage 2 via the transfer gate 13. Next, when the control signal φ2 changes to the low level "L", the transfer gate 13 is turned off, and the transfer gate 12 is turned on. After a delay, the control signal φ1 changes to the low level "L", upon which the transfer gate 11 also is turned off.

Here, during the high level "H" period of the control signal φ1, the output signal INVout of the delay stage 2 is supplied as the signal SCout to the phase comparator 4 via the transfer gate 11. When the control signals φ1 and φ2 are both at the low level "L" (the transfer gates 11 and 13 are off and the transfer gate 12 is on), the output signal INVout of the delay stage 2 is fed back as the input signal INVin to the delay stage 2 via the transfer gate 12. In this way, the signal (INVout) is caused to loop through the delay stage 2 a plurality of times, the signal thus being delayed according to the number of delay elements it passes through.

When the clock signal CLK is supplied to the delay stage 2 via the transfer gate 13, as described above, the voltage of the input signal INVin rises to the high level "H"; the signal change point is transferred progressively through the delay stage 2, and the signal emerging as the output signal INVout of the delay stage 2 is returned to the selection circuit 1. When the voltage of the signal INVout changes from the high level "H" to the low level "L", a change occurs in the state of the second ring counter 102 to which the signal INVout inverted by the inverter 17 is input. At this time, since the transfer gates 11 and 13 are both off, and the transfer gate 12 is on, the signal INVout is again input to the delay stage 2 via the transfer gate 12. Next, when the voltage of the signal INVout changes from the low level "L" to the high level "H", the first ring counter 101 changes state.

More specifically, the delay stage output signal (delayed signal) INVout is supplied to the clock terminal clk of the first ring counter 101 via the NAND gate 19 and inverter 16 as well as to the clock terminal clk of the second ring counter 102 via the inverter 17. The first ring counter 101 counts by detecting the falling edge of the signal INVout, and outputs the signal SSR1 (data "1", "3", "5": signals θ (2π/3), θ (4π/3), θ (2π)). On the other hand, the second ring counter 102 outputs the signal SSR2 (data "0", "2", "4": signals θ (π/3), θ (π), θ (5π/3)). Using the outputs of the ring counters 101 and 102, the control signals φ1 and φ2 are generated to perform the on/off control of the transfer gates 11 to 13. In the phase comparator (4), phase comparison is performed, for example, by making three cycles of the synchronized signal INVout correspond to one cycle of the clock signal CLK, as previously described.

Figure 8:
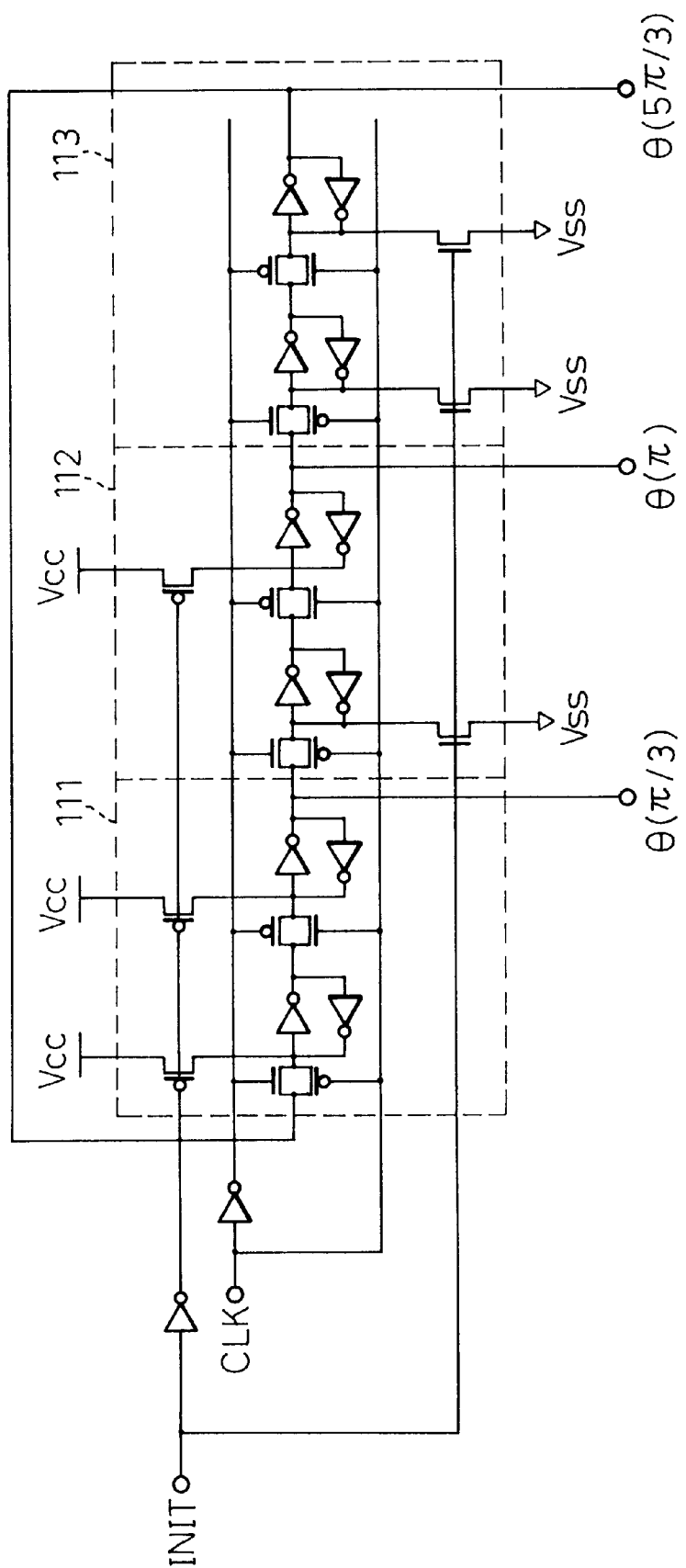
FIG. 8 is a circuit diagram showing one example of a first ring counter in the selection circuit of FIG. 6.
Figure 9:
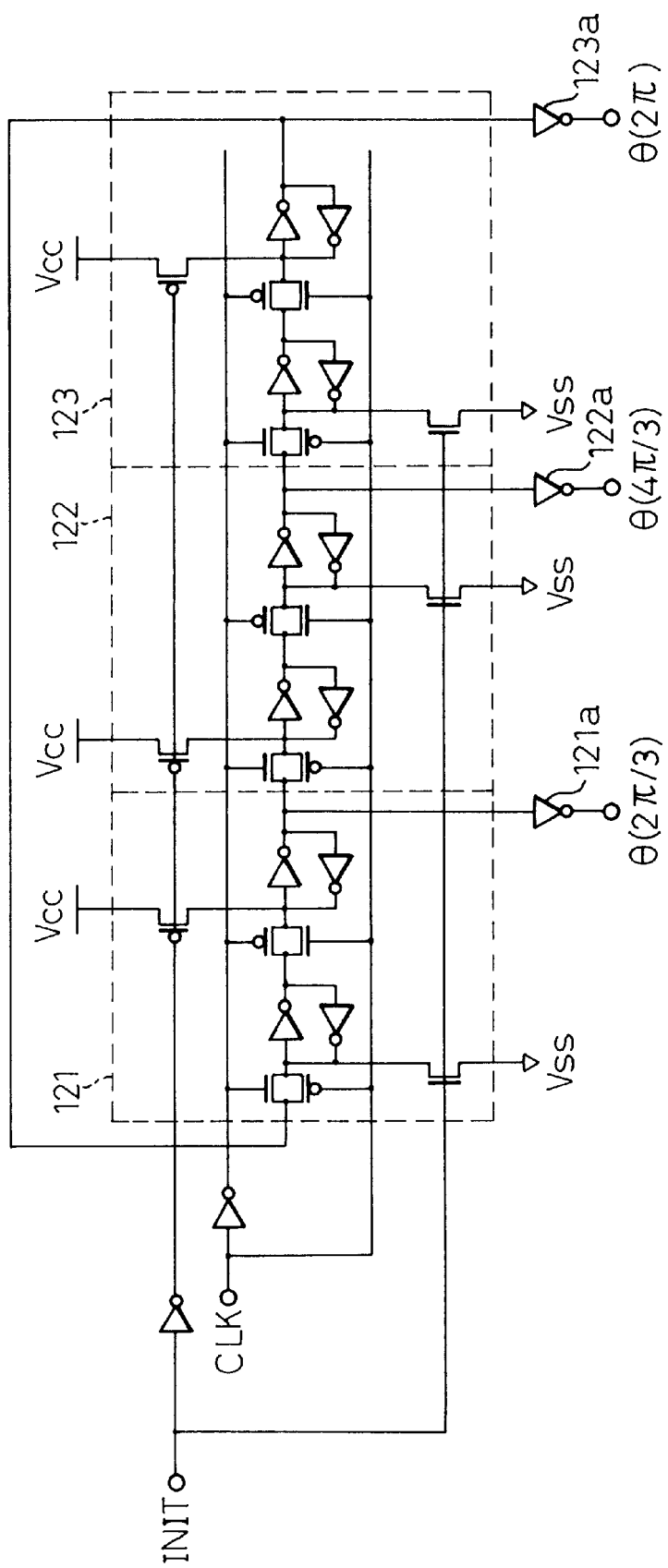
FIG. 9 is a circuit diagram showing one example of a second ring counter in the selection circuit of FIG. 6.

FIG. 8 is a circuit diagram showing one example of the first ring counter in the selection circuit of FIG. 6, and FIG. 9 is a circuit diagram showing one example of the second ring counter in the selection circuit of FIG. 6.

As shown in FIG. 8, the first ring counter 101 (R1) is constructed by connecting three stages of master-slave flip-flops 111 to 113 in a ring arrangement so that three states (data "1", "3", and "5") are repeated in a cyclic manner. As shown in FIG. 9, the second ring counter 102 (R2) also is constructed by connecting three stages of master-slave flip-flops 121 to 123 in a ring arrangement so that three states (data "0", "2", and "4") are repeated in a cyclic manner. That is, the basic circuit configuration is the same between the first ring counter 101 and the second ring counter 102, the only difference being that the control clock is inverted between them. Here, in the second ring counter 102, the signals θ (2π/3), θ (4π/3), and θ (2π) are output through inverters 121a, 122a, and 123a, respectively, to retain signal logic integrity.

With the above first and second ring counters 101 and 102, the delay stage output signal INVout with six voltage changes (three low-to-high transitions and three high-to-low transitions) is synchronized to one cycle of the clock signal CLK.

Figure 10:
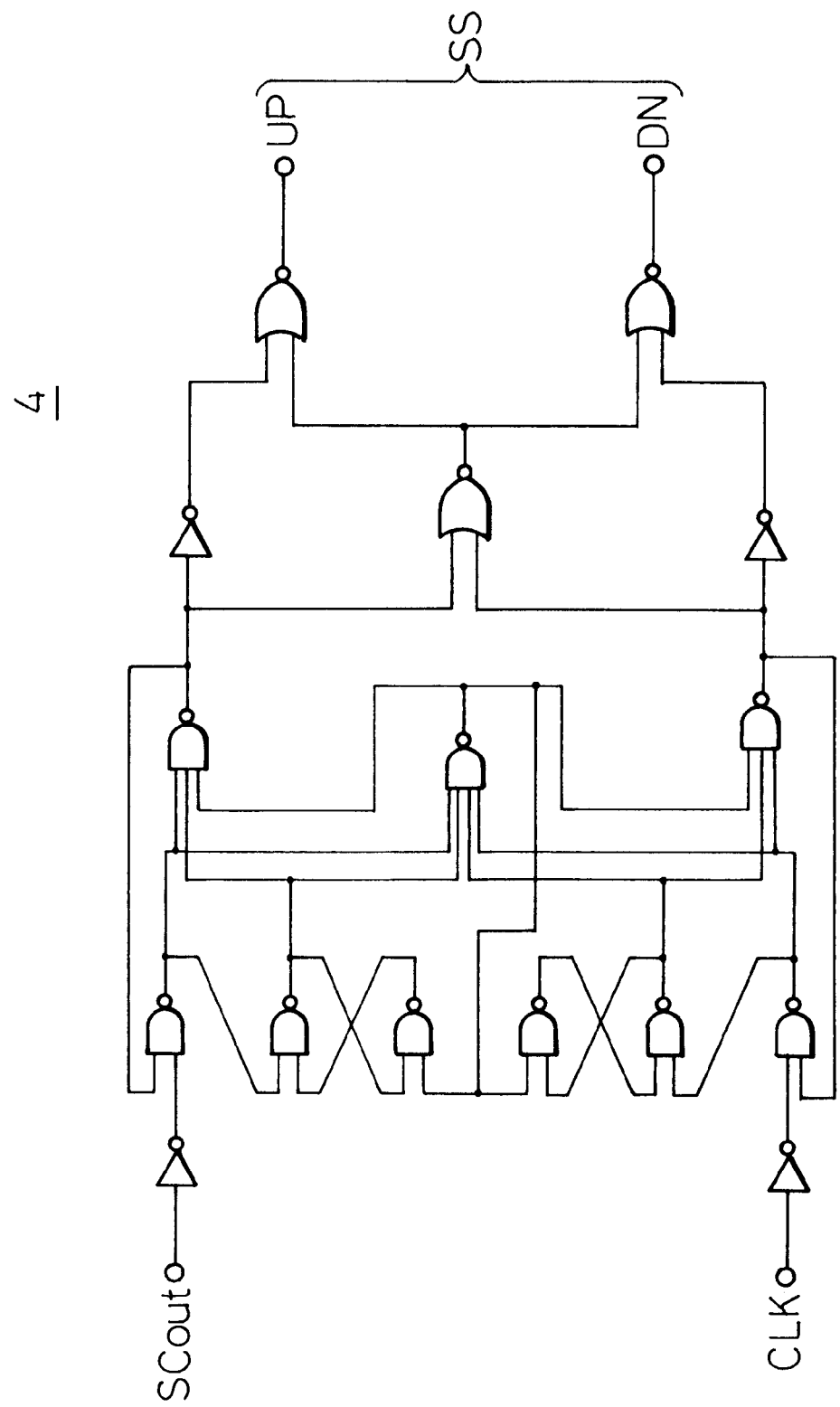
FIG. 10 is a circuit diagram showing one example of a phase comparator in the phase-locked loop circuit of FIG. 4.
Figure 11A:
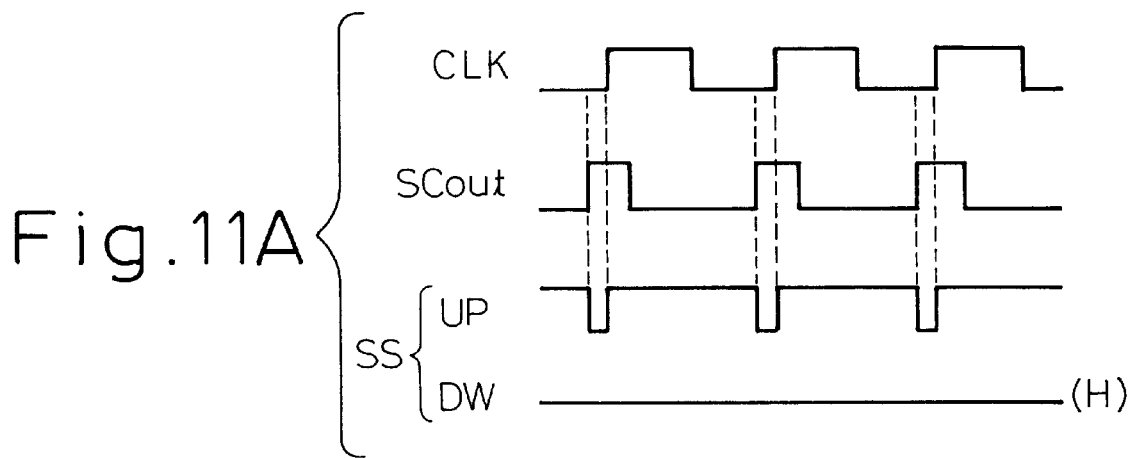
FIGS. 11A and 11B are diagrams for explaining the operation of the phase comparator of FIG. 10.
Figure 11B:
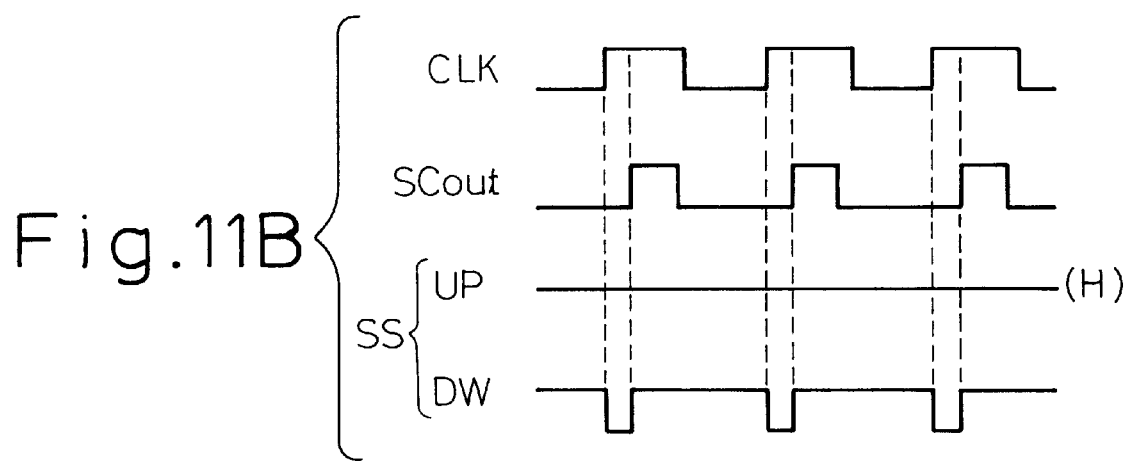

FIG. 10 is a circuit diagram showing one example of the phase comparator 4 in the phase-locked loop circuit of FIG. 4, and FIGS. 11A and 11B are timing diagrams for explaining the operation of the phase comparator of FIG. 10.

The phase comparator 4 detects the time difference between the rising of the output signal SCout of the selection circuit 1 and the rising of the clock signal CLK, and if the signal SCout rises earlier than the clock signal CLK, that is, if the delay stage output signal INVout (for example, the signal at every third cycle) is advanced in phase with respect to the clock signal CLK, the up signal UP (the control signal SS to the up-down counter 3) is driven to the low level "L", as shown in FIG. 11A, thereby performing control so as to increase the amount of delay in the delay stage 2 (by increasing the number of delay units that must be passed through). Conversely, if the signal SCout rises later than the clock signal CLK, that is, if the delay stage output signal INVout is delayed in phase with respect to the clock signal CLK, the down signal DW (the control signal SS to the up-down counter 3) is driven to the low level "L", as shown in FIG. 11B, thereby performing control so as to reduce the amount of delay in the delay stage 2 (by reducing the number of delay units that must be passed through). In this way, three cycles of the delay stage output signal (delayed signal) INVout, for example, are synchronized with respect to one cycle of the clock signal CLK.

Figure 12:
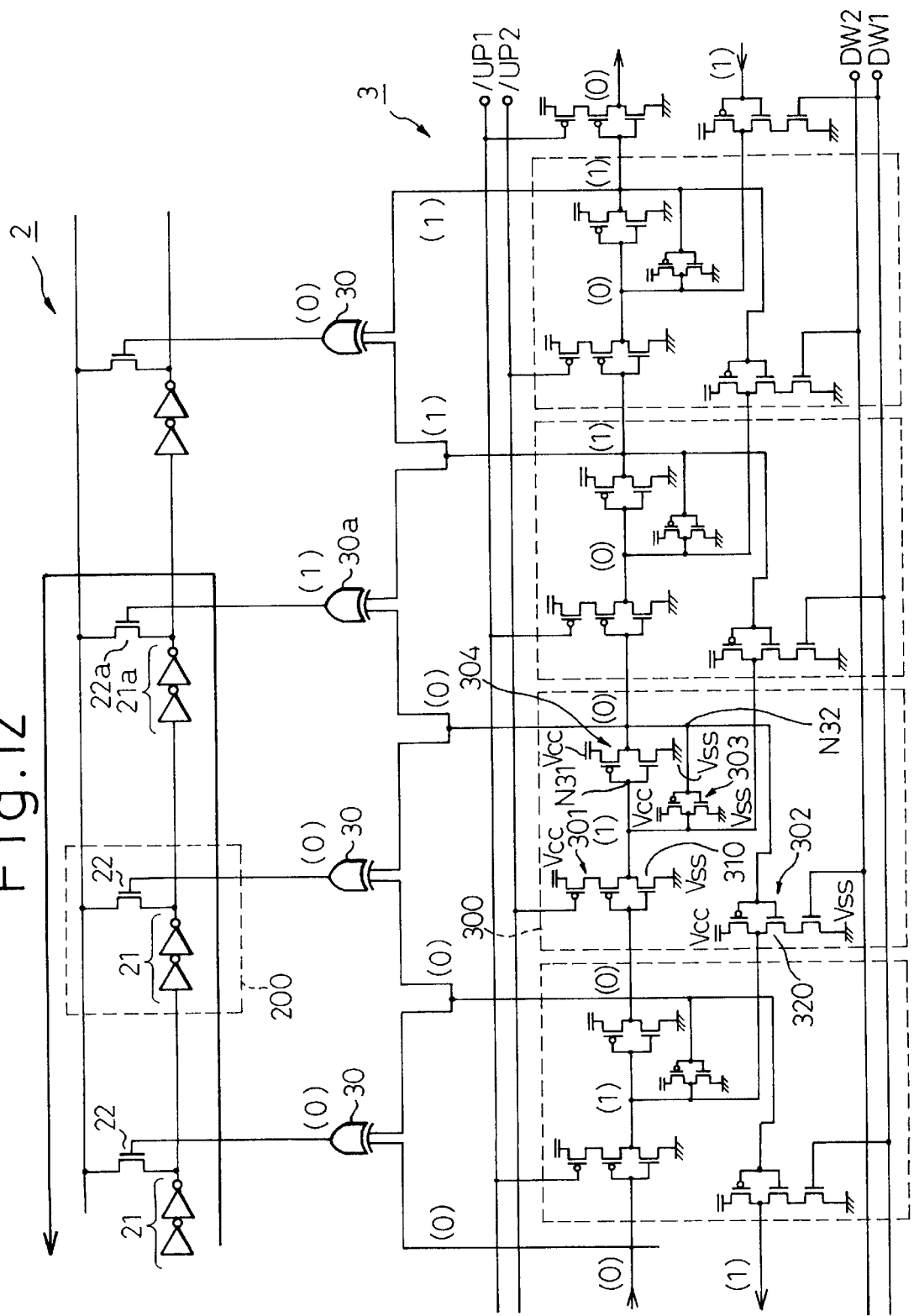
FIG. 12 is a circuit diagram showing one example of an up-down counter in the phase-locked loop circuit of FIG. 4.

FIG. 12 shows one example of the up-down counter in the phase-locked loop circuit of FIG. 4; the configuration of the delay stage 2 is also shown together with the up-down counter 3.

As shown in FIG. 12, the up-down counter 3 comprises a plurality of unit circuits 300 connected in cascade, each unit circuit 300 consisting of an inverter 301 controlled by the up signal (/UP1, /UP2), an inverter 302 controlled by the down signal (DW1, DW2), and cross-coupled inverters 303 and 304.

In the unit circuit 300, the up signal /UP2 (/UP1) is applied to the gate of a P-channel MOS transistor (first transistor) connected to a first inverter 310 and a high-level power supply line Vcc, while the down signal DW2 (DW1) is applied to the gate of an N-channel MOS transistor (second transistor) connected to a second inverter 320 and a low-level power supply line Vss.

The output signal of the first inverter 310 is supplied to one node N31 of the cross-coupled third and fourth inverters 303 and 304, and the output signal of the second inverter 320 is supplied to the other node N32 of the cross-coupled inverters 303 and 304.

Output signals from two adjacent unit circuits 300 (output signals from the inverters 304 in the respective circuits) are supplied to an EOR gate 30 (30a). With this configuration, only the EOR gate 30a connected to two adjacent unit circuits 300 outputting different signal states outputs a high level "H" signal, and the remaining EOR gates 30 output a low level "L" signal. The output of each EOR gate 30 (30a) is coupled to the gate of the gate transistor 22 (22a) in the corresponding delay unit 200 in the delay stage 2, the configuration being such that only the transfer gate 22a in the delay unit selected by the up-down counter 3 is turned on, thus giving the input signal INVin a delay produced up to the inverter 21a in that delay unit.

In the up-down counter 3 shown in FIG. 12, the up signal /UP2 and down signal DW2 or the up signal /UP1 and down signal DW1 are supplied to every other unit circuit 300. Here, control is performed in the following manner: by inputting the up signals /UP1 and /UP2 alternately, the discrimination level between the low-level output "L" and high-level output "H" of the unit circuit 300 is shifted to the high-level output "H" side to increase the amount of delay in the delay stage 2, and by inputting the down signals DW1 and DW2 alternately, the discrimination level between the low-level output "L" and high-level output "H" of the unit circuit 300 is shifted to the low-level output FLU side to reduce the amount of delay in the delay stage 2.

In this way, according to the up-down counter 3 of the present embodiment, since the plurality of up signals /UP1 and /UP2 and down signals DW1 and DW2 are used as the signal SS to control the up-down counter, the delay amount in the delay stage 2, which is controlled through the up-down counter 3, can be controlled at high speed.

Figure 13:
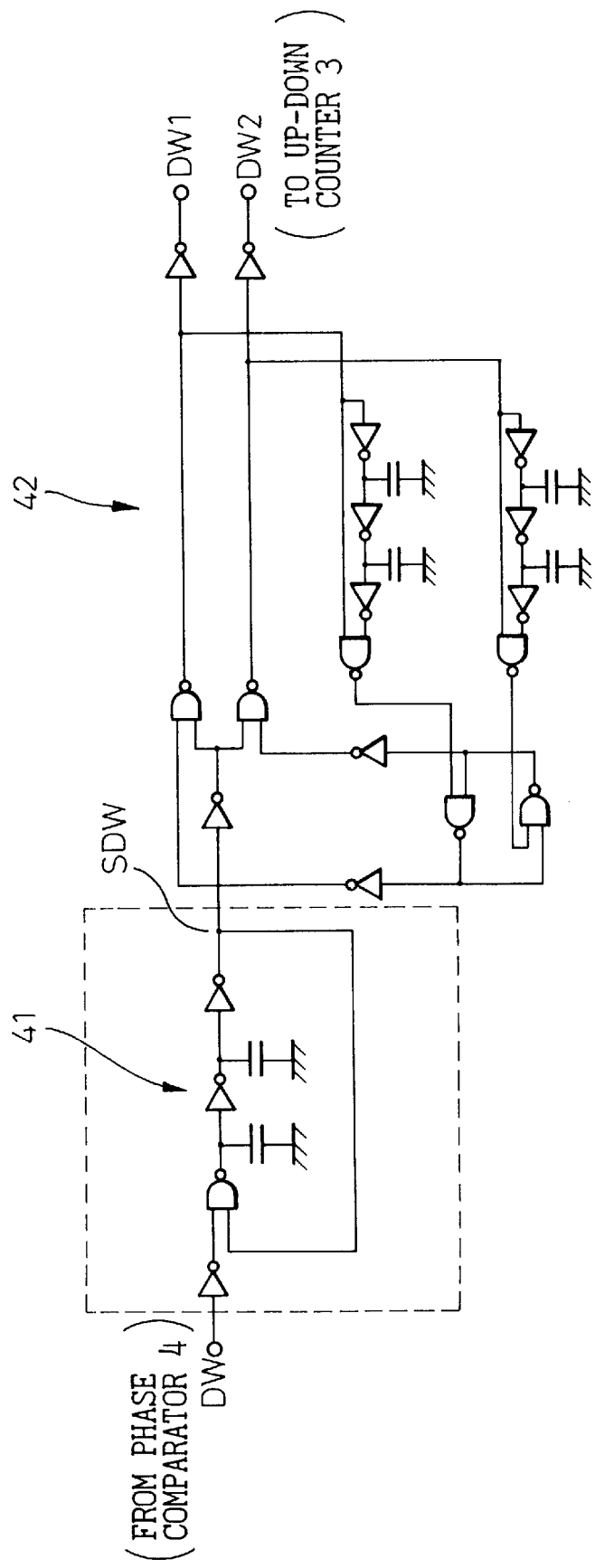
FIG. 13 is a circuit diagram showing one example of a toggle circuit which generates control signals used for the up-down counter of FIG. 12.
Figure 14:
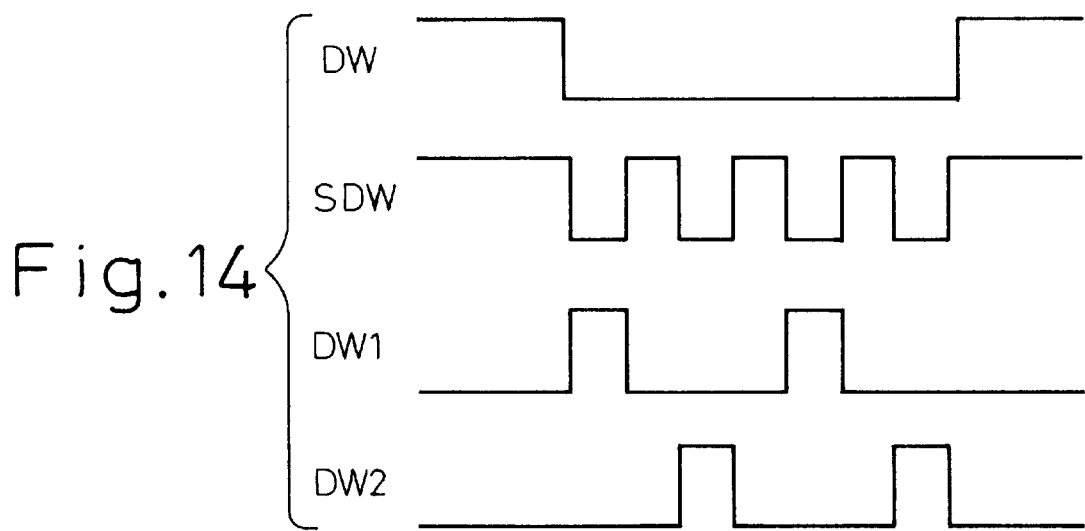
FIG. 14 is a timing diagram for explaining the operation of the toggle circuit of FIG. 13.

FIG. 13 is a circuit diagram showing one example of a toggle circuit which generates the control signals (DW1, DW2) used to control the up-down counter of FIG. 12, and FIG. 14 is a timing diagram for explaining the operation of the toggle circuit of FIG. 13. In FIG. 13, reference numeral 41 designates a slicer circuit, and 42 indicates the toggle circuit.

As shown in FIG. 13, the down signal DW (control signal SS) for the up-down counter 3, which is output from the phase comparator 4, is input, for example, to the slicer circuit 41, where the period during which the down signal DW is at the low level "L" (the pulse width of the down signal) is sliced, and the resulting signal SDW is supplied to the toggle circuit 42. Namely, when the down signal DW is at the high level "H", an output signal of the NAND circuit in the slicer circuit 41 is maintained at the high level "H". On the other hand, when the down signal DW is at the low level "L", an output signal of the NAND circuit in the slicer circuit 41 is changed in accordance with the signal SDW, or the delay time determined by two stages of inverters and capacitors provided at the output of the NAND circuit. Here, the pulse width of the signal SDW obtained from the slicer circuit 41 is determined by the values of capacitors, etc. in the slicer circuit 41, and the number of pulses of the signal SDW during the low level period of the down signal DW can be adjusted as necessary.

The toggle circuit 42 generates pulses corresponding to the high level and low level periods of the signal SDW, thereby generating the two down signals (dual down signal) DW1 and DW2 which are output alternately. The up signal UP for the up-down counter 3 can also be constructed as a dual signal in like manner. In this way, the two down signals DW1 and DW2 are generated each of which is output, for example, twice for one down signal DW, so that the amount of control by which the delay amount in the delay stage 2 is controlled via the up-down counter 3 in one operation can be increased (for example, can be doubled). Furthermore, by controlling the capacitance values of the capacitors, etc. in the slicer circuit 41, the delay amount in the delay stage 2 that can be changed by the application of one down signal (up signal) can be adjusted in various ways.

Figure 15:
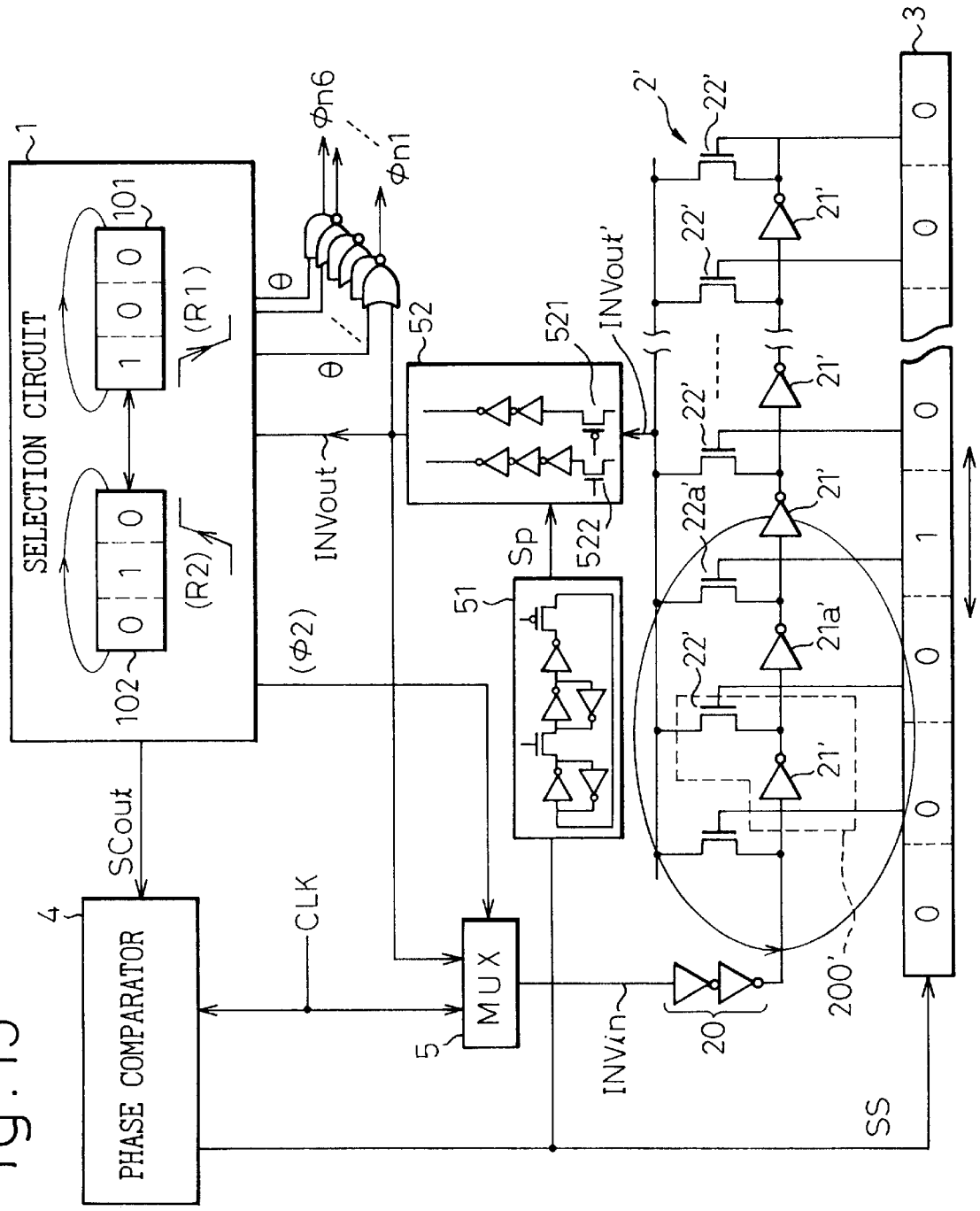
FIG. 15 is a block diagram showing another embodiment of the phase-locked loop circuit according to the present invention.

FIG. 15 is a block diagram showing another embodiment of the phase-locked loop circuit of the present invention, which differs from the phase-locked loop circuit previously shown in FIG. 4 in that the number of inverters in each delay unit 200 of the delay stage 2 is reduced to one.

More specifically, while each delay unit 200 in the phase-locked loop circuit of FIG. 4 consists of the two inverters 21 connected in series and the transfer gate (N-channel MOS transistor) 22, each delay unit 200' in the phase-locked loop circuit of the present embodiment consists of a single inverter 21' and a transfer gate 22'. With this configuration, the delay amount introduced by each delay unit 200' is reduced (by one-half), achieving high-precision (high-resolution) delay control.

In the phase-locked loop circuit shown in FIG. 15, since the number of inverters in each delay unit 200' is reduced to one (the inverter 21'), logic is inverted through each delay unit 200'. In the phase-locked loop circuit of the present embodiment, therefore, the output signal INVout' of the delay stage 2' is passed through a signal logic control circuit 52 where signal logic is controlled before being supplied as the signal INVout to the selection circuit 1.

The signal logic control circuit 52, under the control of a toggle flip-flop circuit 51 supplied with the output signal (control signal SS) of the phase comparator 4, supplies the output signal INVout' of the delay stage 2' to the selection circuit 1 without inverting or after inverting it. More specifically, when shifting (up or down) through an even number of stages up to the selected delay unit (the transfer gate 22a'), the output signal INVout' of the delay stage 2' is output without inverting, that is, the output signal Sp of the toggle flip-flop circuit 51 is at the low level "L" so that a P-channel MOS transistor 521 is selected; on the other hand, when shifting through an odd number of stages, the output signal INVout' of the delay stage 2' is output after being inverted, that is, the signal Sp is at the high level "H" so that an N-channel MOS transistor 522 is selected. The other circuits, including the selection circuit 1, the up-down counter 3, the phase comparator 4, and the delay stage input selection circuit 5, are the same in configuration as the corresponding circuits in the phase-locked loop circuit shown in FIG. 4, and descriptions of such circuits will not be repeated here.

Figure 16:
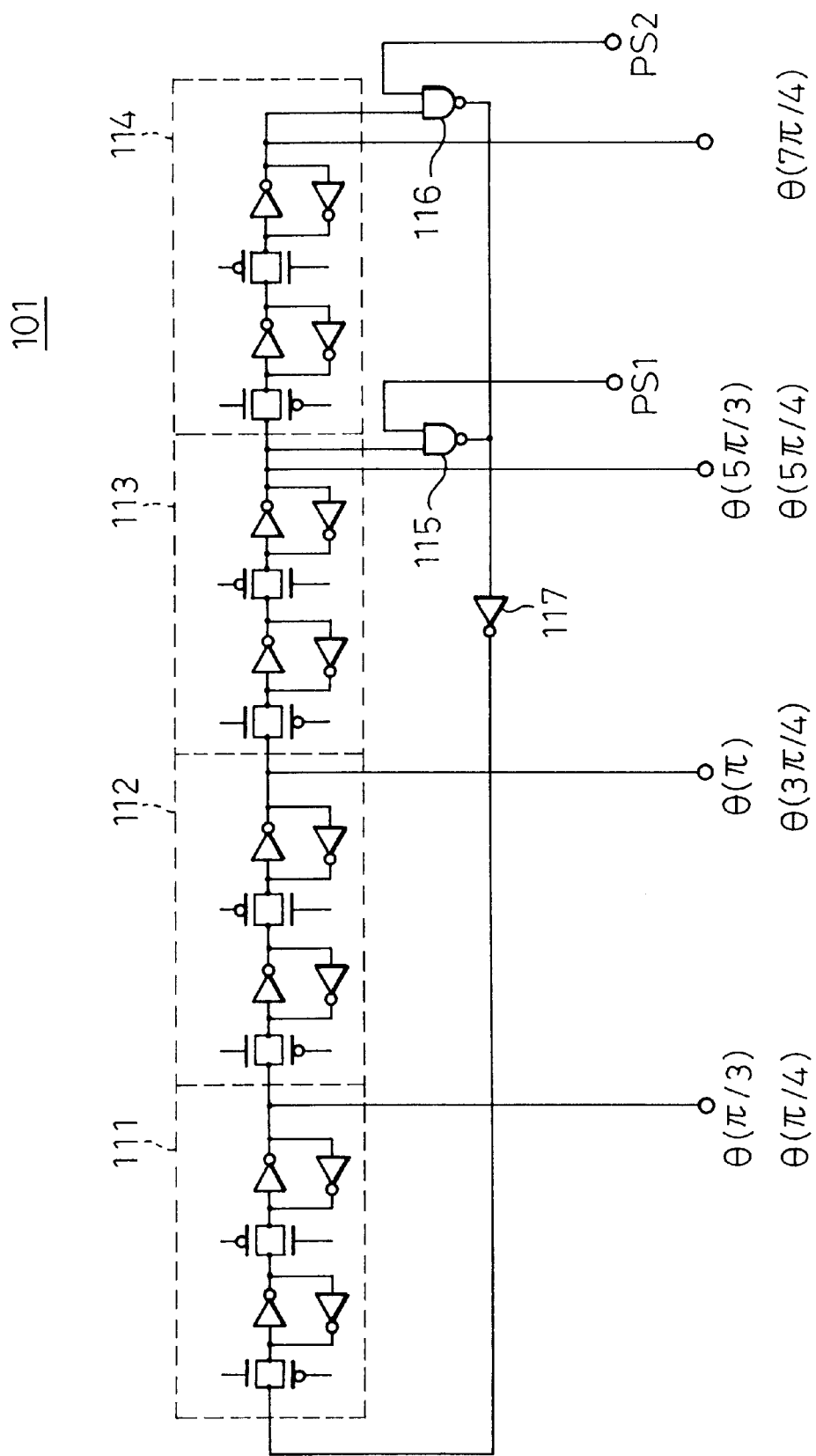
FIG. 16 is a circuit diagram showing one modified example of the ring counter in the phase-locked loop circuit of the present invention.

FIG. 16 is a circuit diagram showing one modified example of the ring counter used in the phase-locked loop circuit of the present invention, illustrating an essential portion of the first ring counter 101 described with reference to FIG. 8 but with the following modifications made to it.

As shown in FIG. 16, in the ring counter of this modified example, an additional unit circuit 114 is provided to add one more stage in the ring counter 101 of FIG. 8, and NAND gates 115 and 116 are provided to control the number of circuit stages (number of bits). Also, an inverter 117 is provided to retain signal logic integrity against the provision of the NAND gate 115 (116).

In the ring counter 101 of FIG. 16, when signal PS1 is set to the high level "H" to select three stages of unit circuits (master-slave flip-flops) 111 to 113, of the six signals differing 60 degrees in phase the signals θ (π/3), θ (π), and θ (5π/3) are extracted, as in the ring counter of FIG. 8. On the other hand, when the signal PS1 is set to the low level "L" and signal PS2 set to the high level "H", four stages of unit circuits (master-slave flip-flops) 111 to 114 are selected, and of the eight signals differing 45 degrees in phase, the signals θ (π/4), θ (3π/4), θ (5π/4), and θ (7π/4) are extracted. By configuring the second ring counter 102 in the same manner, the remaining signals θ (2π/3), θ (4π/3), and θ (2π), or θ (π/2), θ (π), θ (3π/2), and θ (2π), can also be extracted.

Figure 17:
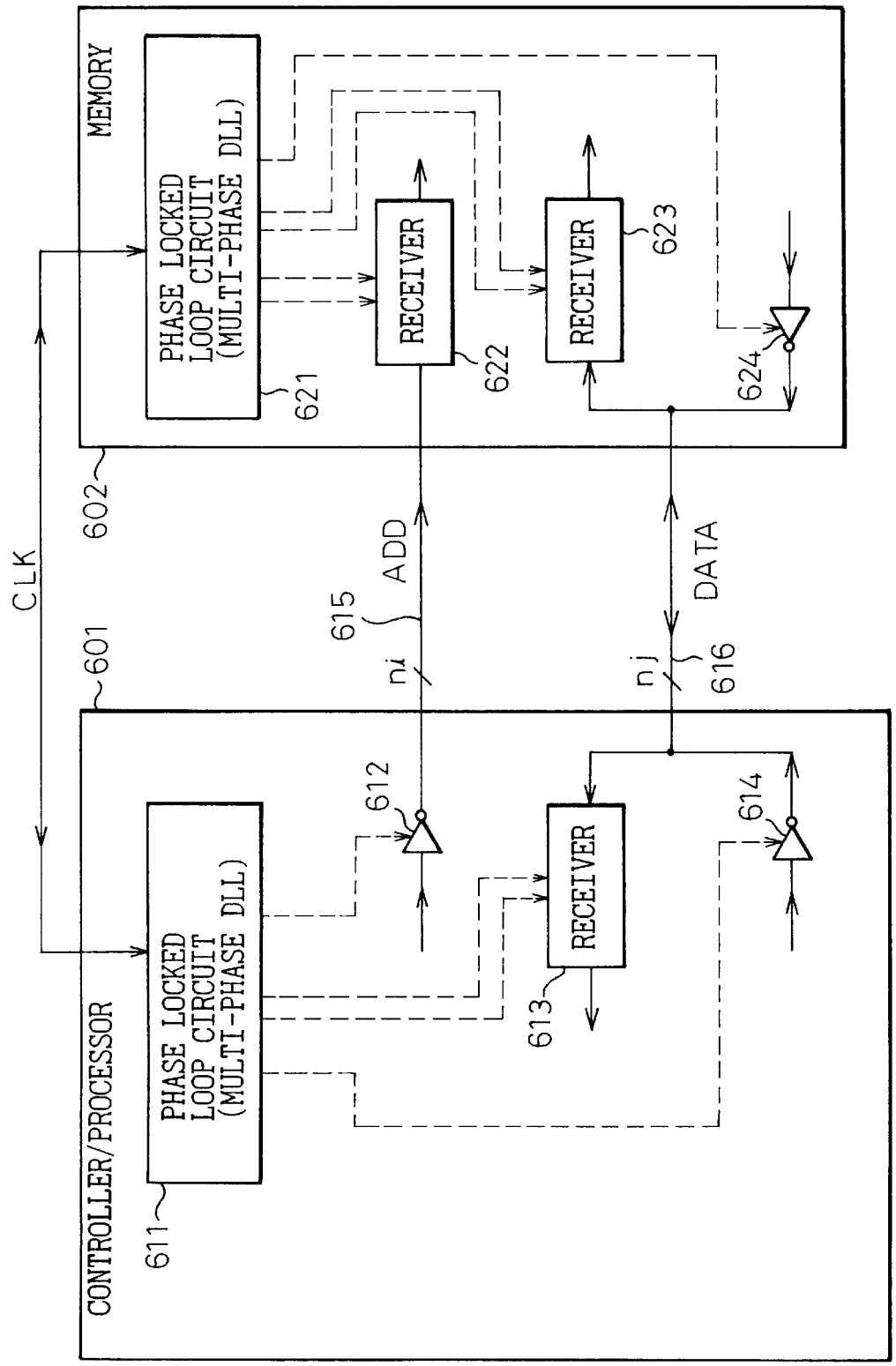
FIG. 17 is a block circuit diagram showing one example of the configuration where the phase-locked loop circuit of the present invention is applied.

FIG. 17 is a block circuit diagram showing one example of the configuration where the phase-locked loop circuit of the present invention is applied, wherein reference numeral 601 is a controller (memory controller or processor) and 602 is a memory (for example, DRAM). Further, reference numeral 615 is an ni-bit unidirectional address bus directed from the controller to the memory, and 616 is an nj-bit bidirectional data bus connecting between the controller and the memory.

The controller 601 comprises the above-described phase-locked loop circuit (multi-phase delay-locked loop: multi-phase DLL) 611 of the present invention, an address signal driver 612, a data signal receiver 613, and a data signal driver 614. Here, the phase-locked loop circuit 611 supplies output signals, synchronized to an external clock (clock signal CLK), to the drivers 612 and 614 and the receiver 613. Of the previously described synchronized signals (φn1 to φn6) with different phases, optimum signals are selected and supplied to the drivers 612 and 614 and the receiver 613 by considering the operating margin, line propagation delay, etc. of each circuit.

The memory 602 includes the phase-locked loop circuit 621 of the present invention, an address signal receiver 622, a data signal receiver 623, and a data signal driver 624. Here, the phase-locked loop circuit 621 supplies output signals, synchronized to the clock signal CLK, to the receivers 622 and 623 and the driver 624. Of the previously described synchronized signals (φn1 to φn6) with different phases, optimum signals are selected and supplied to the receivers 622 and 623 and the driver 624 by considering the operating margin, line propagation delay, etc. of each circuit.

The phase-locked loop circuit of the present invention is not limited in application to the controller 601 and memory 602, but can also be applied for various types of semiconductor integrated circuit. The configuration of the present invention is particularly advantageous for semiconductor integrated circuits that require multi-phase, phase-locked signals as well as reduced circuit size and reduced circuit area and power consumption.

As described in detail above, according to the phase-locked loop circuit of the present invention, by causing a signal to loop through the delay stage a plurality of times, the circuit size can be reduced with a reduced number of delay units constituting the delay stage. Furthermore, according to the phase-locked loop circuit of the present invention, a plurality of synchronized signals with different phases can be generated.

Many different embodiments of the present invention may be constructed without departing from the spirit and scope of the present invention, and it should be understood that the present invention is not limited to the specific embodiments described in this specification, except as defined in the appended claims.

What is claimed is:

1. A phase-locked loop circuit, comprising:
   a delay stage having a plurality of delay units connected in cascade;
   a phase comparator for comparing phase of an input signal with phase of a delayed signal, the delayed signal being created by causing the input signal to loop through said delay stage a plurality of times; and
   an up-down counter for specifying a delay unit in said delay stage, said up-down counter being controlled in an up or down direction by an up or down signal output from said phase comparator, wherein an amount of delay in said delay stage, corresponding to the number of delay units, is produced up to the delay unit specified by said up-down counter.

2. A phase-locked loop circuit as claimed in claim 1, wherein said phase-locked loop circuit further comprises a slicer circuit and a toggle circuit which are supplied with the up signal or down signal from said phase comparator, and generates a plurality of up signals or down signals within a pulse width of said up signal or down signal.

3. A phase-locked loop circuit as claimed in claim 1, wherein said up-down counter includes a plurality of unit circuits connected in cascade, and each of said unit circuits comprises:
   a first inverter;
   a first transistor connected to said first inverter and a high-level power supply line and whose gate is supplied with the up signal;
   a second inverter;
   a second transistor connected to said second inverter and a low-level power supply line and whose gate is supplied with the down signal; and
   cross-coupled third and fourth inverters, whose one node is supplied with an output signal from said first inverter and whose other node is supplied with an output signal from the second inverter.

4. A phase-locked loop circuit as claimed in claim 3, wherein said up-down counter includes a plurality of exclusive-OR circuits each for accepting outputs from two adjacent unit circuits, and a signal is output only from one exclusive-OR circuit that has detected a change in the output signals of said two adjacent unit circuits, thereby selecting a designated delay unit in said delay stage.

5. A phase-locked loop circuit as claimed in claim 3, wherein said up signal and down signal each include two signals, the first and second up signals and the first and second down signals, respectively, and said first up signal and said first down signal are supplied to the unit circuits at even-numbered stages while said second up signal and said second down signal are supplied to the unit circuits at odd-numbered stages.

6. A phase-locked loop circuit as claimed in claim 1, wherein said phase-locked loop circuit further comprises a selection circuit which is supplied with said input signal and said delayed signal, and said selection circuit selects a signal to be supplied to said delay stage and said phase comparator, in such a manner as to synchronize predetermined cycles of said delayed signal with respect to one cycle of said input signal.

7. A phase-locked loop circuit as claimed in claim 6, wherein said selection circuit includes a counter means, and controls the number of times that said delay signal loops through said delay stage by detecting a change in said delayed signal using said counter means.

8. A phase-locked loop circuit as claimed in claim 7, wherein said counter means comprises a first ring counter which counts by detecting a falling edge of said delayed signal, and a second ring counter which counts by detecting a rising edge of said delayed signal.

9. A phase-locked loop circuit as claimed in claim 8, wherein said selection circuit generates a plurality of synchronized signals with different phases by taking logic between said first and second ring counters and said delayed signal.

10. A phase-locked loop circuit as claimed in claim 9, wherein said first and second ring counters each comprise a plurality of unit circuits connected in cascade, and the number of said synchronized signals is controlled by selecting the number of said unit circuits.

11. A phase-locked loop circuit as claimed in claim 1, wherein each of said delay units comprises two inverters connected in cascade and a transfer gate for selecting an output signal of said delay unit.

12. A phase-locked loop circuit as claimed in claim 1, wherein each of said delay units comprises a single inverter and a transfer gate for selecting an output signal of said delay unit.

13. A phase-locked loop circuit as claimed in claim 12, wherein said phase-locked loop circuit includes a signal logic control circuit for controlling logic of the output signal of said delay unit in accordance with the number of shift stages in said up-down counter.

14. A semiconductor integrated circuit having a phase-locked loop circuit, comprising:
   a delay stage having a plurality of delay units connected in cascade;
   a phase comparator for comparing phase of an input signal with phase of a delayed signal, the delayed signal being created by causing the input signal to loop through said delay stage a plurality of times; and
   an up-down counter for specifying a delay unit in said delay stage, said up-down counter being controlled in an up or down direction by an up or down signal output from said phase comparator, wherein an amount of delay in said delay stage, corresponding to the number of delay units, is produced up to the delay unit specified by said up-down counter.

15. A semiconductor integrated circuit as claimed in claim 14, wherein said phase-locked loop circuit further comprises a slicer circuit and a toggle circuit which are supplied with the up signal or down signal from said phase comparator, and generates a plurality of up signals or down signals within a pulse width of said up signal or down signal.

16. A semiconductor integrated circuit as claimed in claim 14, wherein said up-down counter includes a plurality of unit circuits connected in cascade, and each of said unit circuits comprises:
   a first inverter;
   a first transistor connected to said first inverter and a high-level power supply line and whose gate is supplied with the up signal;
   a second inverter;
   a second transistor connected to said second inverter and a low-level power supply line and whose gate is supplied with the down signal; and
   cross-coupled third and fourth inverters, whose one node is supplied with an output signal from said first inverter and whose other node is supplied with an output signal from the second inverter.

17. A semiconductor integrated circuit as claimed in claim 16, wherein said up-down counter includes a plurality of exclusive-OR circuits each for accepting outputs from two adjacent unit circuits, and a signal is output only from one exclusive-OR circuit that has detected a change in the output signals of said two adjacent unit circuits, thereby selecting a designated delay unit in said delay stage.

18. A semiconductor integrated circuit as claimed in claim 16, wherein said up signal and down signal each include two signals, the first and second up signals and the first and second down signals, respectively, and said first up signal and said first down signal are supplied to the unit circuits at even-numbered stages while said second up signal and said second down signal are supplied to the unit circuits at odd-numbered stages.

19. A semiconductor integrated circuit as claimed in claim 14, wherein said phase-locked loop circuit further comprises a selection circuit which is supplied with said input signal and said delayed signal, and said selection circuit selects a signal to be supplied to said delay stage and said phase comparator, in such a manner as to synchronize predetermined cycles of said delayed signal with respect to one cycle of said input signal.

20. A semiconductor integrated circuit as claimed in claim 19, wherein said selection circuit includes a counter means, and controls the number of times that said delay signal loops through said delay stage by detecting a change in said delayed signal using said counter means.

21. A semiconductor integrated circuit as claimed in claim 20, wherein said counter means comprises a first ring counter which counts by detecting a falling edge of said delayed signal, and a second ring counter which counts by detecting a rising edge of said delayed signal.

22. A semiconductor integrated circuit as claimed in claim 21, wherein said selection circuit generates a plurality of synchronized signals with different phases by taking logic between said first and second ring counters and said delayed signal.

23. A semiconductor integrated circuit as claimed in claim 22, wherein said first and second ring counters each comprise a plurality of unit circuits connected in cascade, and the number of said synchronized signals is controlled by selecting the number of said unit circuits.

24. A semiconductor integrated circuit as claimed in claim 14, wherein each of said delay units comprises two inverters connected in cascade and a transfer gate for selecting an output signal of said delay unit.

25. A semiconductor integrated circuit as claimed in claim 14, wherein each of said delay units comprises a single inverter and a transfer gate for selecting an output signal of said delay unit.

26. A semiconductor integrated circuit as claimed in claim 25, wherein said phase-locked loop circuit includes a signal logic control circuit for controlling logic of the output signal of said delay unit in accordance with the number of shift stages in said up-down counter.

27. A phase-locked loop circuit comprising:
a delay stage having a plurality of delay units connected in cascade;
a delay circuit receiving an input signal for propagating the input signal therethrough a plurality of times to generate a delayed signal; and
a phase comparator for comparing a phase of the input signal and that of the delayed signal to output an instruction signal, wherein an amount of a delay time in the delay circuit, corresponding to the number of delay units, is responsive to the instruction signal.

28. A phase-locked loop circuit, comprising:
a delay stage having a plurality of delay units connected in cascade;
a phase comparator for comparing phase of an input signal with phase of a delayed signal, the delayed signal being created by causing the input signal to loop through said delay stage a plurality of times;
an up-down counter for specifying a delay unit in said delay stage, said up-down counter being controlled in an up or down direction by an up or down signal output from said phase comparator, wherein an amount of delay in said delay stage is produced up to the delay unit specified by said up-down counter; and
a selection circuit, receiving said input signal and said delayed signal, and selecting a signal to be supplied to said delay stage and said phase comparator, in such a manner as to synchronize predetermined cycles of said delayed signal with respect to one cycle of said input signal, said selection circuit including a counter for detecting a change in said delayed signal.

* * * * *